United States Patent
Yang et al.

(10) Patent No.: US 8,661,311 B2
(45) Date of Patent: Feb. 25, 2014

(54) SYSTEMS AND METHODS FOR DYNAMIC SCALING IN A DATA DECODING SYSTEM

(71) Applicant: LSI Corporation, San Jose, CA (US)

(72) Inventors: Shaohua Yang, San Jose, CA (US); Milos Ivkovic, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/789,829

(22) Filed: Mar. 8, 2013

(65) Prior Publication Data
US 2013/0191618 A1    Jul. 25, 2013

Related U.S. Application Data

(62) Division of application No. 12/763,050, filed on Apr. 19, 2010, now Pat. No. 8,418,019.

(51) Int. Cl.
*H03M 13/00* (2006.01)

(52) U.S. Cl.
USPC ............... 714/752; 714/786; 714/799

(58) Field of Classification Search
USPC ......................... 714/752, 755, 799
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |

(Continued)

OTHER PUBLICATIONS

U.S. Appl. No. 13/426,714, filed Mar. 22, 2012, Shaohua Yang.

(Continued)

*Primary Examiner* — Esaw Abraham
(74) *Attorney, Agent, or Firm* — Hamilton DeSanctis & Cha

(57) ABSTRACT

Various embodiments of the present invention provide systems and methods for data processing using variable scaling.

18 Claims, 9 Drawing Sheets

(56) References Cited

U.S. PATENT DOCUMENTS

| | | | |
|---|---|---|---|
| 6,473,878 B1 | 10/2002 | Wei | |
| 6,535,553 B1 | 3/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2* | 6/2006 | Song et al. | 714/752 |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,237,181 B2* | 6/2007 | Richardson | 714/780 |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Vila Casado et al. | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,020,078 B2* | 9/2011 | Richardson | 714/780 |
| 8,201,051 B2 | 6/2012 | Tan | |
| 8,225,168 B2* | 7/2012 | Yu et al. | 714/752 |
| 8,237,597 B2 | 8/2012 | Liu | |
| 8,261,171 B2 | 9/2012 | Annampedu | |
| 8,291,284 B2 | 10/2012 | Savin | |
| 8,291,299 B2 | 10/2012 | Li et al. | |
| 8,295,001 B2 | 10/2012 | Liu | |
| 2007/0297496 A1* | 12/2007 | Park et al. | 375/148 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009.

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 1.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systems—I: Reg.

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Weon-Cheol Lee et al., "Vitirebi Decoding Method Using Channel State Info. in COFDM System" IEEE Trans. on Consumer Elect., IEEE Service Center, NY, NY vol. 45, No. 3 Aug. 1999.

Xiao, et al "Nested Codes With Multiple Interpretations" retrieved from the Internet URL: http://www.ece.nmsu.edu/~jkliewer/paper/XFKC_CISS06 (retrieved on Dec. 5, 2012).

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. on Circuits, Regular Papers, vol. 5, No. 4, pp. 766-775, Apr. 2005.

U.S. Appl. No. 13/327,279, Unpublished, (filed Dec. 15, 2011) (Wei Feng).

U.S. Appl. No. 13/295,150, Unpublished, (filed Nov. 14, 2011) (Zongwang Li).

(56) References Cited

OTHER PUBLICATIONS

U.S. Appl. No. 13/284,730, Unpublished, (filed Oct. 28, 2011) (Fan Zhang).
U.S. Appl. No. 13/269,852, Unpublished, (filed Oct. 10, 2011) (Haitao Xia).
U.S. Appl. No. 13/369,468, Unpublished, (filed Feb. 9, 2012) (Zongwang Li).
U.S. Appl. No. 13/340,951, Unpublished, (filed Dec. 30, 2011) (Lei Chen).
U.S. Appl. No. 13/213,751, Unpublished, (filed Aug. 19, 2011) (Fan Zhang).
U.S. Appl. No. 13/340,974, Unpublished, (filed Dec. 30, 2011) (Dan Liu).
U.S. Appl. No. 13/227,544, Unpublished, (filed Sep. 8, 2011) (Shaohua Yang).
U.S. Appl. No. 13/445,878, Unpublished, (filed Apr. 12, 2012) (Yu Liao).
U.S. Appl. No. 13/316,741, Unpublished, (filed Dec. 12, 2011) (Yang Han).
U.S. Appl. No. 13/316,858, Unpublished, (filed Dec. 12, 2011) (Zongwang Li).
U.S. Appl. No. 13/362,409, Unpublished, (filed Jan. 31, 2012) (Fan Zhang).
U.S. Appl. No. 13/412,520, Unpublished, (filed Mar. 5, 2012) (Fan Zhang).
U.S. Appl. No. 13/445,848, Unpublished, (filed Apr. 12, 2012) (Bruce Wilson).
U.S. Appl. No. 13/305,510, Unpublished, (filed Nov. 28, 2011) (Lei Chen).
U.S. Appl. No. 13/296,022, Unpublished, (filed Nov. 14, 2011) (Victor Krachkovsky).
U.S. Appl. No. 13/174,537, Unpublished, (filed Jun. 30, 2011) (Anantha Raman Krishnan).
U.S. Appl. No. 13/174,453, Unpublished, (filed Jun. 30, 2011) (Johnson Yen).
U.S. Appl. No. 13/180,495, Unpublished, (filed Jul. 11, 2011) (Chung-Li Wang).
U.S. Appl. No. 13/621,341, Unpublished, (filed Sep. 17, 2012) (Shaohua Yang).
U.S. Appl. No. 13/284,767, Unpublished, (filed Oct. 28, 2011) (Fan Zhang).
U.S. Appl. No. 13/302,119, Unpublished, (filed Nov. 22, 2011) (Lei Chen).
U.S. Appl. No. 13/269,832, Unpublished, (filed Oct. 10, 2011) (Haitao Xia).
U.S. Appl. No. 13/305,551, Unpublished, (filed Nov. 28, 2011) (Yang Han).
U.S. Appl. No. 13/227,416, Unpublished, (filed Sep. 7, 2011) (Lei Chen).
U.S. Appl. No. 13/426,714, Unpublished, (filed Mar. 22, 2012) (Shaohua Yang).
U.S. Appl. No. 13/186,234, Unpublished, (filed Jul. 19, 2011) (Haitao Xia).
U.S. Appl. No. 13/239,683, Unpublished, (filed Sep. 22, 2011) (Changyou Xu).
U.S. Appl. No. 13/283,549, Unpublished, (filed Oct. 27, 2011) (Wu Chang).
U.S. Appl. No. 13/300,078, Unpublished, (filed Nov. 18, 2011) (Chung-Li Wang).
U.S. Appl. No. 13/989,583, Unpublished, (filed Oct. 15, 2012) (Shaohua Yang).
U.S. Appl. No. 13/705,407, Unpublished, (filed Dec. 5, 2012) (Lingyan Sun).
U.S. Appl. No. 13/426,693, Unpublished, (filed Mar. 22, 2012) (Shaohua Yang).
U.S. Appl. No. 13/483,105, Unpublished, (filed May 30, 2012) (Xuebin Wu).
U.S. Appl. No. 13/619,907, Unpublished, (filed Sep. 14, 2012) (Fan Zhang).
U.S. Appl. No. 13/483,100, Unpublished, (filed May 30, 2012) (Fan Zhang).
U.S. Appl. No. 13/372,580, Unpublished, (filed Feb. 14, 2012) (Fan Zhang).
U.S. Appl. No. 13/415,326, Unpublished, (filed Mar. 8, 2012) (Shaohua Yang).
U.S. Appl. No. 13/415,430, Unpublished, (filed Mar. 8, 2012) (Nayak Ratnakar Aravind).
U.S. Appl. No. 13/113,219, Unpublished, (filed May 23, 2011) (Yang Han).
U.S. Appl. No. 13/422,986, Unpublished, (filed Mar. 16, 2012) (Fan Zhang).
U.S. Appl. No. 13/171,615, Unpublished, (filed Jun. 29, 2011) (Bradley D. Seago).
U.S. Appl. No. 13/597,001, Unpublished, (filed Aug. 28, 2012) (Fan Zhang).
U.S. Appl. No. 13/596,978, Unpublished, (filed Aug. 28, 2012) (Fan Zhang).
U.S. Appl. No. 13/596,947, Unpublished, (filed Aug. 28, 2012) (Fan Zhang).
U.S. Appl. No. 13/596,819, Unpublished, (filed Aug. 28, 2012) (Shaohua Yang).
U.S. Appl. No. 13/545,833, Unpublished, (filed Jul. 10, 2012) (Zhi Bin Li).
U.S. Appl. No. 13/433,693, Unpublished, (filed Mar. 29, 2012) (Fan Zhang).
U.S. Appl. No. 13/474,660, Unpublished, (filed May 17, 2012) (Zongwang Li).
U.S. Appl. No. 13/597,026, Unpublished, (filed Aug. 28, 2012) (Fan Zhang).

* cited by examiner

SYSTEMS AND METHODS FOR DYNAMIC SCALING IN A DATA DECODING SYSTEM

CROSS REFERENCE TO RELATED APPLICATIONS

The Present application is a continuation of U.S. patent application Ser. No. 12/763,050 (now issued as U.S. Pat. No. 8,418,019) entitled "Systems and Methods for Dynamic Scaling in a Data Decoding System" and filed by Ivkovic et al. on Apr. 19, 2010. The entirety of the aforementioned reference is incorporated herein by reference for all purposes.

BACKGROUND OF THE INVENTION

The present inventions are related to systems and methods for detecting and/or decoding information, and more particularly to systems and methods for performing variably scaled data processing.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream.

To heighten the possibility of convergence, various existing processes utilize two or more detection and decode iterations. Turning to FIG. 1, an exemplary prior art two stage data detection and decode circuit 100 is depicted. Two stage data detection and decode circuit 100 receives a data input 105 that is applied to a detector 110. A hard and soft output from detector 110 is provided to a Low Density Parity Check decoder ("an LDPC decoder") 115. Input 105 is fed forward via a buffer 130 to another detector 120. Detector 120 uses a soft output of LDPC decider 115 and input 105 to perform an additional data detection process. A hard and soft output from detector 120 is provided to an LDPC decoder 125 that performs a second decoding process and provides an output 135. Where the initial detection and decode provided by detector 110 and LDPC decoder 115 does not converge, the subsequent detection and decode provided by detector 120 and LDPC decoder 125 provide an additional opportunity to converge. In these systems, various scalars are designed into the systems to massage data between various stages of the process. These scalars are either fixed at design time or are programmable static values that can be adjusted once the system is deployed in a storage medium. In some cases, however, data from one stage to another stage saturates limiting the capability of the system.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for performing variably scaled data processing.

Various embodiments of the present invention provide data processing circuits that include a decoder circuit and a scalar circuit. The decoder circuit is operable to perform a data decoding algorithm by processing at least one decoder message, and the scalar circuit is operable to multiply the decoder message by a variable scalar value. In some instances of the aforementioned embodiments, the scalar circuit multiplies the decoder message by a first instance of the variable decoder value during a first decoding process and by a second instance of the variable scalar value during a second decoding process. In some cases, the first decoding process is performed as part of a first global iteration of the data processing circuit, and the second decoding process is performed as part of a second global iteration of the data processing circuit. In other cases, the first decoding process is performed as part of a first local iteration of the data processing circuit, and the second decoding process is performed as part of a second local iteration of the data processing circuit. In particular cases, the first value is larger than the second value. The first value is selected to encourage rapid convergence of the data decoding algorithm, and the second scalar is selected to provide enhanced information to the data decoding algorithm. In particular instances of the aforementioned embodiments, the decoder circuit is a low density parity check decoder. In some such instances, the low density parity check decoder includes at least one variable node and at least one check node, and the decoder message is passed from the variable node to the check node. In other such instances, the low density parity check decoder includes at least one variable node and at least one check node, and the decoder message is passed from the check node to the variable node.

Other embodiments of the present invention provide data processing systems that include a data detector circuit and a data decoder circuit. The data detector circuit is operable to receive a data input and to provide a detected output. The data decoder circuit is operable to perform one or more local iterations on the detected output and to provide a decoded output. The decoder circuit is operable to perform a data decoding algorithm by processing at least one decoder message, and the decoder circuit includes a scalar circuit operable to multiply the decoder message by a variable scalar value.

Yet other embodiments of the present invention provide methods for data processing that include, applying a data decoding algorithm to a data set including processing at least one decoder message corresponding to the data set; and multiplying the decoder message by a variable scalar value. In some cases, the variable scalar value includes a first scalar value and a second scalar value, the decoder message is a first decoder message, and multiplying the first decoder message by the variable scalar value includes multiplying the first decoder message by the first scalar value. Such methods further include applying the data decoding algorithm to a derivative of the data set including processing at least a second decoder message corresponding to the derivative of the data set; and multiplying the second decoder message by the second scalar value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
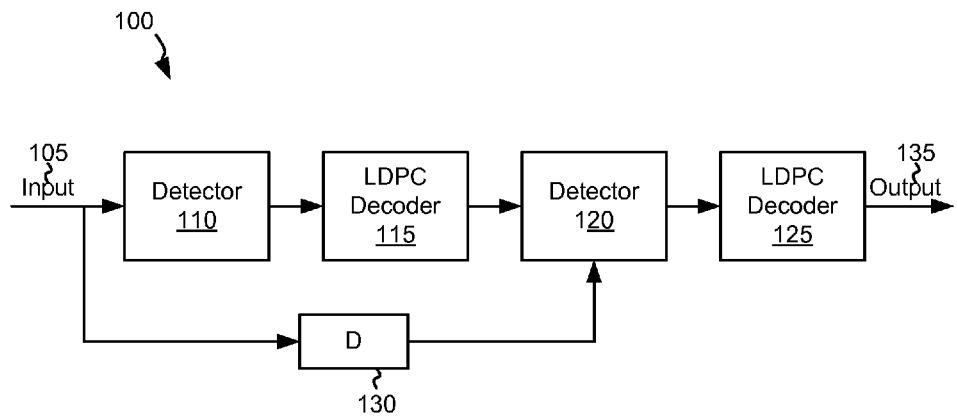
FIG. 1 depicts a prior art two stage data detection and decoding system.

The present inventions are related to systems and methods for detecting and/or decoding information, and more particularly to systems and methods for performing variably scaled data processing.

Various embodiments of the present invention provide solutions for decoding suitable for read channel, wireless transmission and other applications. Such decoding/detection circuitry includes a soft decision decoder providing data to a data detector. The messages within the soft decision decoder are scaled using a local scaling value. Such an approach allows for speeding up convergence of codewords with a relatively small amount of noise through initial use of a relatively high local scalar value, while achieving better decoding performance for codewords that otherwise may not have converged through later use of a relatively low local scalar value.

Some embodiments of the present invention provide data processing circuits that include a decoder circuit and a scalar circuit. As used herein, the phrase "decoder circuit" is used in its broadest sense to mean any circuit that is operable to decode a previously encoded data set. Thus, as an example, a decoder circuit may be an LDPC decoder circuit. Based upon the disclosure provided herein, one of ordinary skill in the art will recognize a variety of decoder circuits that may be used in relation to different embodiments of the present invention. As used herein, the phrase "scalar circuit" is used in its broadest sense to mean any circuit that is operable to scale a received input. Based upon the disclosure provided herein, one of ordinary skill in the art will recognize a variety of scalar circuits that may be used in relation to different embodiments of the present invention. The decoder circuit is operable to perform a data decoding algorithm by processing at least one decoder message, and the scalar circuit is operable to multiply the decoder message by a variable scalar value. As used herein, the phrase "decoder message" is used in its broadest sense to mean any value passed internal to a decoder circuit. Thus, as an example, a decoder message may be a data set passed from a variable node to a check node within an LDPC decoder, or a data set passed from a check node to a variable node within an LDPC decoder. Based upon the disclosure provided herein, one of ordinary skill in the art will recognize a variety of decoder messages that may be used in relation to different embodiments of the present invention.

In some instances of the aforementioned embodiments, the scalar circuit multiplies the decoder message by a first instance (i.e., first value) of the variable decoder value during a first decoding process and by a second instance (i.e., second value) of the variable scalar value during a second decoding process. In some cases, the first decoding process is performed as part of a first global iteration of the data processing circuit, and the second decoding process is performed as part of a second global iteration of the data processing circuit. As used herein, the phrase "global iteration" is used in its broadest sense to mean a process whereby both a data detection algorithm and a data decoding algorithm is applied. Thus, as an example, a global iteration may include application of a data detection algorithm to a data set followed by one or more applications of a data decoding algorithm to the results of the data detection. Based upon the disclosure provided herein, one of ordinary skill in the art will recognize a variety of global iterations that may be used in relation to different embodiments of the present invention. In other cases, the first decoding process is performed as part of a first local iteration of the data processing circuit, and the second decoding process is performed as part of a second local iteration of the data processing circuit. As used herein, the phrase "local iteration" is used in its broadest sense to mean a process whereby one of a data detection algorithm or a data decoding algorithm is applied. Thus, as an example, a local iteration may include application of a data decoding algorithm by a data detector circuit. Where only one application of the data decoding algorithm is applied during a global iteration, it is said that one local iteration occurred. On the other hand, where two or more applications of the data decoding algorithm are applied, it is said that two or more local iterations are applied. Based upon the disclosure provided herein, one of ordinary skill in the art will recognize a variety of local iterations that may be used in relation to different embodiments of the present invention.

Figure 2A:
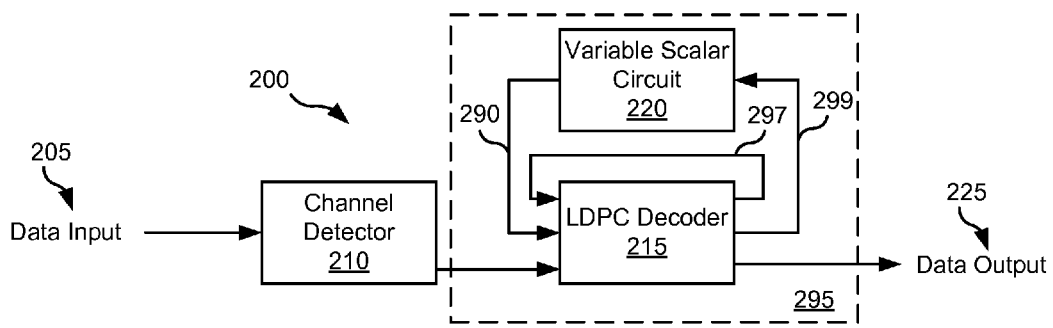
FIG. 2a depicts a data processing circuit that includes a decoder circuit with internal dynamic scaling in accordance with one or more embodiments of the present invention.

Turning to FIG. 2a, a data processing circuit 200 is shown that includes a decoder circuit 295 that includes internal dynamic scaling in accordance with one or more embodiments of the present invention. In addition, data processing circuit 200 includes a channel detector circuit 210. Data processing circuit 200 receives a data input 205 at channel detector 210. Data input 205 may be, for example, derived from a storage medium or from a transmission channel. In particular cases, data input 205 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 210 may be any channel detector known in the art including, but not limited to, a soft output Viterbi algorithm (SOVA) detector or a maximum a posteriori (MAP) detector. Based on the disclosure provided herein, one of ordinary skill in the art will recognize a variety of channel detectors that may be used in accordance with different embodiments of the present invention. The output of channel detector 210 is provided to decoder circuit 295.

Decoder circuit 295 includes an LDPC decoder 215 and a variable scalar circuit 220. LDPC decoder 215 initially performs an LDPC decoding of the output received from channel detector 210. On this initial decoding pass (i.e., initial local iteration), LDPC decoder 215 multiplies the output of channel detector 210 by an initial scalar value provided as an output 290 from variable scalar circuit 220. Once the decoding process is completed, it is determined whether another pass (i.e., another local iteration) through LDPC decoder 215 is desired. This determination may be made based upon whether LDPC decoder 215 converged, and whether a failure to converge would be benefited by an additional pass through LDPC decoder 215. Any approach for determining a need for an additional local decoder loop that is known in the art may be used. Where an additional local iteration is to be performed, LDPC decoder 215 asserts a signal 299, and variable scalar circuit 220 dynamically modifies the scalar value provided as output 290. In addition, an output 297 of LDPC decoder 215 is fed back for re-processing. On the subsequent pass through LDPC decoder 215 the decoding process is applied to output 297 that is multiplied by the modified scalar value received as output 290. This process is repeated for each local iteration through LDPC decoder 215.

In one particular embodiment of the present invention, the initial scalar value provided as output 290 is 0.75, and on each successive local iteration through LDPC decoder 215, variable scalar circuit 220 reduces the scalar value provided as output 290 by a hardware friendly value of $\frac{1}{32}$. Thus, on the second local iteration the scalar value is 0.7188; on the third local iteration the scalar value is 0.6875; on the fourth local iteration the scalar value is 0.6563; on the fifth local iteration the scalar value is 0.625; on the sixth local iteration the scalar value is 0.5938; on the seventh local iteration the scalar value is 0.5625; on the eighth local iteration the scalar value 0.5313; on the ninth local iteration the scalar value is 0.5. At some point, variable scalar circuit 220 discontinues modification of the scalar value provided as output 290, and maintains the scalar value constant. Thus, using the preceding example, on the tenth and later local iterations, variable scalar circuit 220 maintains the scalar value at 0.5. Once all of the local iterations are completed, LDPC decoder 215 provides a data output 225.

Figure 2B:
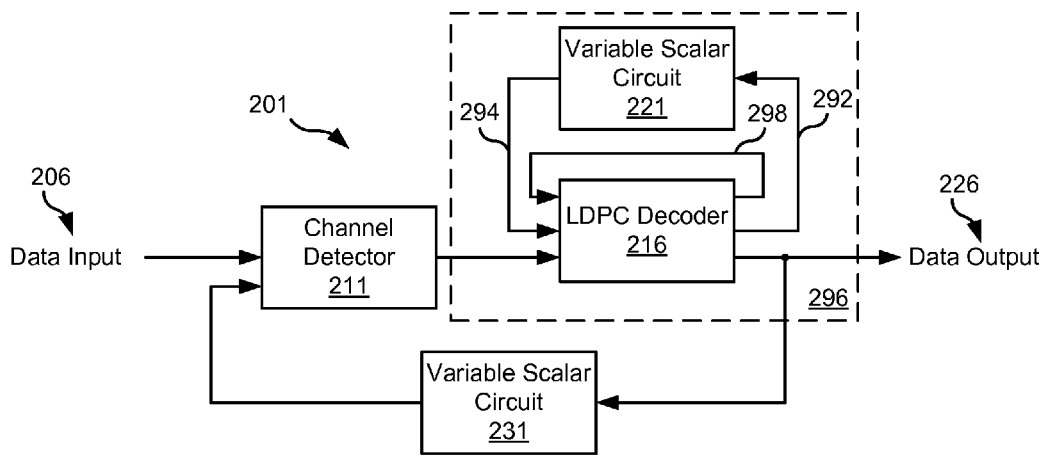
FIG. 2b depicts another data processing circuit that includes a decoder circuit having internal dynamic scaling and global dynamic scaling in accordance with some embodiments of the present invention.

Turning to FIG. 2b, a data processing circuit 201 is shown that includes a decoder circuit 296 having internal dynamic scaling and global dynamic scaling in accordance with some embodiments of the present invention. In addition, data processing circuit 201 includes a channel detector circuit 211 where a data input 206 is received. Data input 206 may be derived from a storage medium or from a transmission channel. In particular cases, data input 206 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 211 may be any channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. The output of channel detector 211 is provided to decoder circuit 296.

Decoder circuit 296 includes an LDPC decoder 216 and a variable scalar circuit 221. LDPC decoder 216 initially performs an LDPC decoding of the output received from channel detector 211. On this initial decoding pass (i.e., initial local iteration), LDPC decoder 216 multiplies the output of channel detector 211 by an initial scalar value provided as an output 294 from variable scalar circuit 221. Once the decoding process is completed, it is determined whether another pass through LDPC decoder 216 is desired. This determination may be made based upon whether LDPC decoder 216 converged, and whether a failure to converge would be benefited by an additional pass through LDPC decoder 216. Any approach for determining a need for an additional local decoder loop that is known in the art may be used. Where an additional local iteration is to be performed, LDPC decoder 216 asserts a signal 296, and variable scalar circuit 221 dynamically modifies the scalar value provided as output 294. In addition, an output 298 of LDPC decoder 216 is fed back for re-processing. On the subsequent pass through LDPC decoder 216 the decoding process is applied to output 298 that is multiplied by the modified scalar value received as output 294. This process is repeated for each local iteration through LDPC decoder 216.

In one particular embodiment of the present invention, the initial scalar value provided as output 294 is 0.75, and on each successive local iteration through LDPC decoder 216, variable scalar circuit 221 reduces the scalar value provided as output 294 by a hardware friendly value of $\frac{1}{32}$. Thus, on the second local iteration the scalar value is 0.7188; on the third local iteration the scalar value is 0.6875; on the fourth local iteration the scalar value is 0.6563; on the fifth local iteration the scalar value is 0.625; on the sixth local iteration the scalar value is 0.5938; on the seventh local iteration the scalar value is 0.5625; on the eighth local iteration the scalar value 0.5313; on the ninth local iteration the scalar value is 0.5. At some point, variable scalar circuit 221 discontinues modification of the scalar value provided as output 294, and maintains the scalar value constant. Thus, using the preceding example, on the tenth and later local iterations, variable scalar circuit 221 maintains the scalar value at 0.5. Once all of the local iterations are completed, LDPC decoder 216 provides a data output 226.

In addition, multiple global iterations (i.e., processing through both channel detector 211 and decoder circuit 296) are possible. Where an additional global iteration is desired, data output 226 is fed back to channel detector 211 where it is reprocessed through both channel detector 211 and decoder circuit 296. A decision about whether to perform another global operation may be made done using any criteria known in the art.

Figure 3:
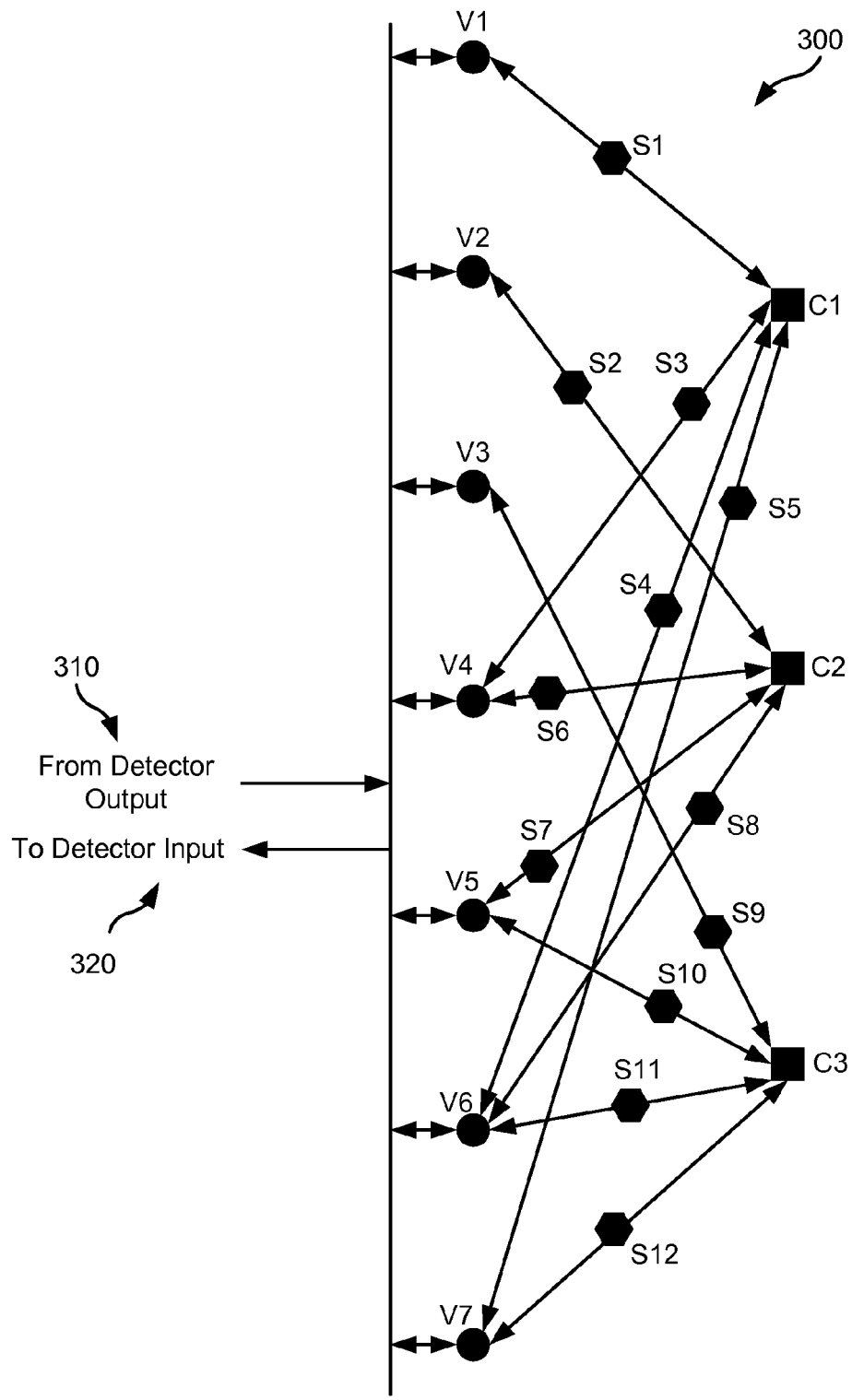
FIG. 3 is a graphical depiction of an LDPC decoder circuit showing dynamic scaling in accordance with some embodiments of the present invention.

Turning to FIG. 3, a graphical depiction 300 of an LDPC decoder circuit showing dynamic scaling in accordance with some embodiments of the present invention. Graphical depiction 300 represents an exemplary operation of an LDPC decoder. Graphical depiction 300 shows an input 310 received from the output of an upstream detector (not shown), and an output 320 that is provided either as a circuit output or to an upstream or downstream detector (not shown). Input data is provided to a number of variable nodes indicated as V1, V2, V3, V4, V5, V6, V7. The messages from the variable nodes are passed to check nodes identified as C1, C2, C3 as indicated by the arrows. These messages are multiplied by the local scalar value using multipliers identified as S1, S2, S3, S4, S5, S6, S7, S8, S9, S10, S11, S12. The local scalar value multiplied by each of multipliers S1, S2, S3, S4, S5, S6, S7, S8, S9, S10, S11, S12 may be dynamically changed depending upon one or both of the number of local iterations and the number of global iterations. The results of the checks implemented by check nodes C1, C2, C3 are provided back to variable nodes V1, V2, V3, V4, V5, V6, V7 without multiplication as shown by the arrows. These results may be provided as output 320, or where another local decoder iteration is desired, the values at variables V1, V2, V3, V4, V5, V6, V7 are again forward to check nodes C1, C2, C3 as indicated by the arrows, and the multiplication by the variable local scalar value is performed. In the process, the messages passed between variables V1, V2, V3, V4, V5, V6, V7 and check nodes C1, C2, C3 are multiplied by the local scalar values in accordance with the following equation:

(Message from $V$ to $C$)=(Local Scalar Value)(Message from $V$ to $C$).

It should be noted that such scaling may be applied to LDPC decoders independent of any updating schedules, and it can be used in relation to layered decoders and decoders utilizing flooding schedules. In addition, it should be noted that while such internal scaling is discussed as being applied to the message transferred from a variable node to a check node, that in other embodiments of the present invention that the scaling may be applied to the message transferred from a check node to a variable node.

Figure 4A:
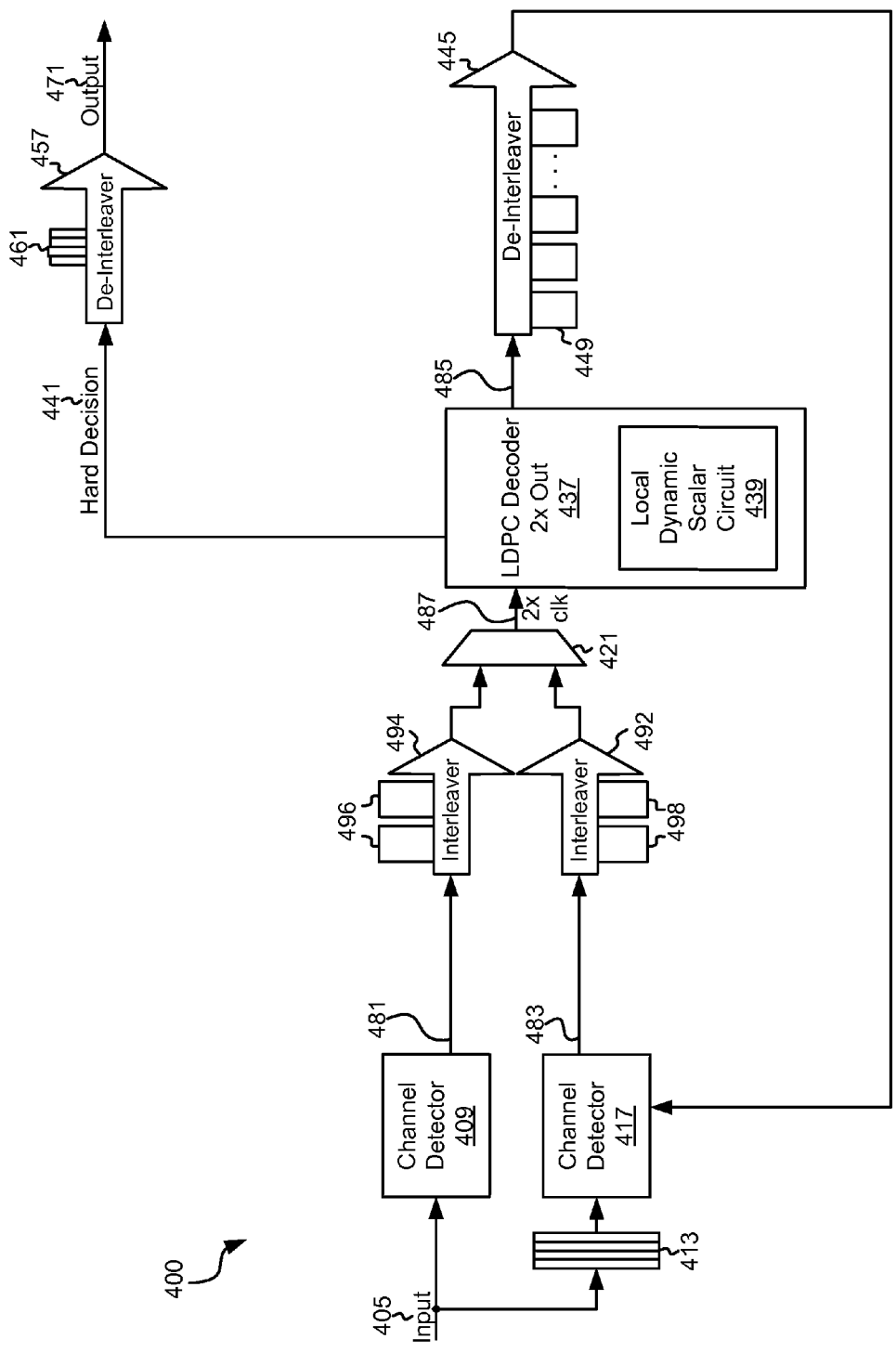
FIG. 4a shows a queuing detection and decoding circuit including dynamic scaling of the decoder messages is shown in accordance with various embodiments of the present invention.

Turning to FIG. 4a, a queuing detection and decoding circuit 400 including dynamic scaling of the decoder messages is shown in accordance with various embodiments of the present invention. Queuing detection and decoding circuit 400 includes a data input 405 that is fed to a channel detector 409. In some embodiments, data input 405 may be derived from a storage medium or from a transmission channel. In particular cases, data input 405 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 409 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 405 is provided to a memory buffer 413 that is designed to hold a number of data sets received from data input 405. The size of memory buffer 413 may be selected to provide sufficient buffering such that a data set provided via data input 405 remains available at least until a first iteration processing of that same data set is complete and the processed data is available in a queue buffer 449 as more fully described below. Memory buffer 413 provides the data sets to a channel detector 417. Similar to channel detector 409, channel detector 417 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

An output 481 of channel detector 409 is provided to an interleaver circuit 494, and an output 483 of channel detector 417 is provided to a another interleaver circuit 492. Interleaver circuit 494 interleaves the output of channel detector 409 using a ping pong buffer 496, and interleaver circuit 492 interleaves the output of channel detector 417 using a ping pong buffer 498. One of the buffers in ping pong buffer 496 holds the result of a prior interleaving process of the output from channel detector 409 and is unloaded to an LDPC decoder 437 via a multiplexer 421, while the other buffer of ping pong buffer 496 holds a data set from channel detector 409 that is currently being interleaved. Similarly, one of the buffers in ping pong buffer 498 holds the result of a prior interleaving process of the output from channel detector 417 and is unloaded to LDPC decoder 437 via multiplexer 421, while the other buffer of ping pong buffer 498 holds a data set from channel detector 417 that is currently being interleaved. It should be noted that other soft decision data decoders may be used in place of LDPC decoder 437 in different embodiments of the present invention.

LDPC decoder 437 is capable of decoding one or more data sets simultaneously. As an example, LDPC decoder 437 may be designed to decode an interleaved data set from ping pong buffer 496, to decode an interleaved data set from ping pong buffer 498, or to decode interleaved data sets from ping pong buffer 496 and ping pong buffer 498 simultaneously. One or more passes through LDPC decoder 437 may be desired. Again, such passes are referred to herein as local iterations and involve re-processing the outputs of LDPC decoder 437 by the LDPC decoder again. In such cases, the internal messages of LDPC decoder 437 may be multiplied by a local dynamic scalar value that is generated by a local dynamic scalar circuit 439. This multiplication process may be implemented similar to that discussed above in relation to FIG. 3.

In some embodiments of the present invention, local dynamic scalar circuit 439 provides an initial local scalar value that is used on a first global iteration (i.e., processing through channel detector 409 and LDPC decoder 437), and the same local scalar value is used for each successive local iteration that follows the particular global iteration. As each additional global iteration occurs (i.e., processing through channel detector 417 and LDPC decoder 437), the scalar value is reduced by a defined amount, and the reduced scalar value is used for the succeeding local iterations. In one particular embodiment of the present invention, the initial scalar value is 0.75, and on each successive global iteration local dynamic scalar circuit 439 reduces the scalar value by a hardware friendly value of 1/32. Thus, on the second global iteration the scalar value is 0.7188; on the third global iteration the scalar value is 0.6875; on the fourth global iteration the scalar value is 0.6563; on the fifth global iteration the scalar value is 0.625; on the sixth global iteration the scalar value is 0.5938; on the seventh global iteration the scalar value is 0.5625; on the eighth global iteration the scalar value 0.5313; on the ninth global iteration the scalar value is 0.5. At some point, local dynamic scalar circuit 439 discontinues modification of the local scalar value, and maintains the local scalar value constant. Thus, using the preceding example, on the tenth and later global iterations, local dynamic scalar circuit 439 maintains the local scalar value at 0.5. Prior to performing the decoding process, LDPC decoder 437 multiplies a data output 487 from multiplexer 421 by the local scalar value from local dynamic scalar circuit 439. It should be noted that in other embodiments of the present invention that the value of the local scalar value may be modified after each local iteration in addition to, or in place of modification that occurs after each global iteration.

As a general rule, using a higher local scalar value results in increasing the rate of convergence by a decoder where there is low noise. In contrast, using a lower local scalar value results in reducing the rate of convergence while increasing the possibility of convergence where higher noise is exhibited in one or more of the bits in the data stream. The higher probability of convergence occurs because bits multiplied by a smaller scalar is less likely to saturate the decoder circuit and therefore more data is maintained for use in the decoding process. By using a variable local scalar value, some embodiments of the present invention provide for relatively fast convergence on various areas in a codeword that exhibit lower levels of noise. Later, the areas in a codeword that exhibit higher levels of noise are treated with progressively lower scalars that reduce the rate of convergence, but increase the range of data that may be used to achieve the convergence.

Once the desired local iterations are completed by LDPC decoder 437, the resulting decoded data is either provided as a hard decision output 441 or as an output 485 to a de-interleaver circuit 445 that uses queue buffer 449 to de-interleave the decoded data and to store the de-interleaved data until channel detector 417 is available for further processing.

One of the buffers in queue buffer 449 holding the result of a prior de-interleaving process and is unloaded to channel detector 417, while another buffer of queue buffer 449 holds a decoded data set currently being de-interleaved, and one or more other buffers in queue buffer 449 maintain other non-converged data waiting for processing by channel detector 417. Non-converged data from queue buffer 449 is de-interleaved by de-interleaver 445 and passed to channel detector 417 that has access to the corresponding data set in memory buffer 413. The data detection performed by channel detector 417 is similar to that performed by channel detector 409. Alternatively, where a data set converges in LDPC decoder 437, it is provide as hard decision output 441 to a de-interleaver circuit 457 that de-interleaves the received hard decision output 441 and stores the de-interleaved result in one of a number of memory buffers 461. Ultimately, de-interleaver circuit 457 provides the de-interleaved data stored in memory buffers 461 as an output 471.

Queuing detection/decoding circuit 400 allows for performance of a variable number of detection and decoding iterations depending upon the introduced data. Further, in some cases, considerable power savings may be achieved through use of queuing detection/decoding circuit 400. Yet further, in some cases, a faster LDPC decoder may be implemented allowing for an increased throughput where substantial first iteration data convergence exists as multiple iterations are not necessarily required. Yet further, by allowing results of LDPC decoder 437 to be reported out of order, upstream processing does not have to wait for the completion of downstream processing. Re-ordering of the out of order results may be done by queuing detection/decoding circuit 400 or by a downstream recipient of output 471. In addition, using a dynamic scalar within decoder 437 allows for resolving substantially noise free areas of a codeword quickly using a relatively high local scalar value, and to resolve more noisy areas of a codeword using a relatively small local scalar value. Based upon the disclosure provided herein, one of ordinary skill in the art will recognize a variety of other advantages that may be achieved through implementation of one or more embodiments of the present invention.

Figure 4B:
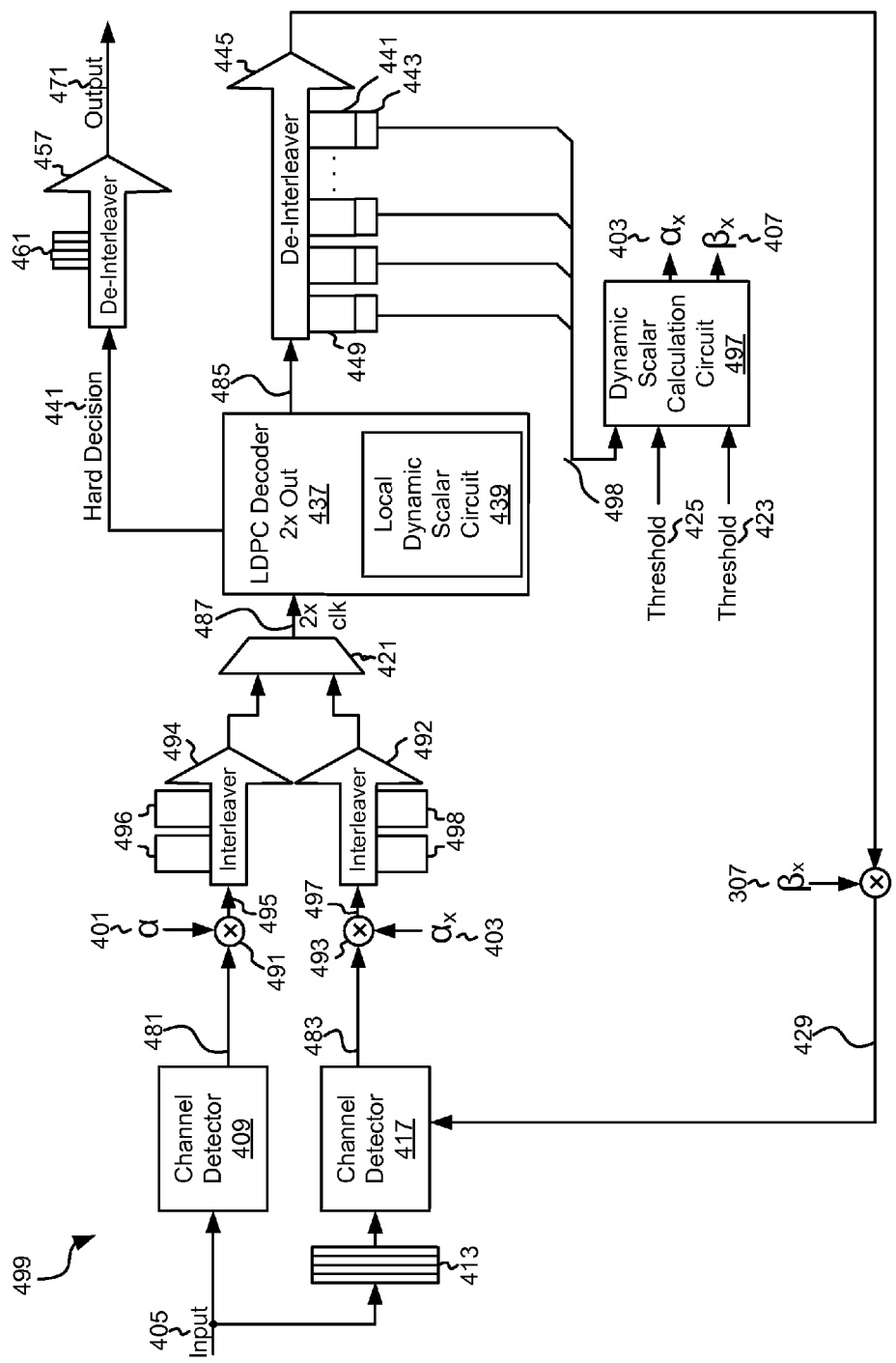
FIG. 4b depicts a queuing detection and decoding circuit including dynamic scaling of the decoder messages and dynamic scaling in the global loop in accordance with various embodiments of the present invention.

Turning to FIG. 4b, a queuing detection and decoding circuit 499 including dynamic scaling of the decoder messages and dynamic scaling in the global loop is shown in accordance with various embodiments of the present invention. Queuing detection and decoding circuit 499 includes data input 405 that is fed to channel detector 409. In addition, data input 405 is provided to memory buffer 413 that is designed to hold a number of data sets received from data input 405. The size of memory buffer 413 may be selected to provide sufficient buffering such that a data set provided via data input 405 remains available at least until a first iteration processing of that same data set is complete and the processed data is available in queue buffer 449 as more fully described below. Memory buffer 413 provides the data sets to a channel detector 417.

Output 481 of channel detector 409 is provided to interleaver circuit 494, and output 483 of channel detector 417 is provided to interleaver circuit 492. Interleaver circuit 494 interleaves the output of channel detector 409 using ping pong buffer 496, and interleaver circuit 492 interleaves the output of channel detector 417 using ping pong buffer 498. One of the buffers in ping pong buffer 496 holds the result of a prior interleaving process of the output from channel detector 409 and is unloaded to LDPC decoder 437 via multiplexer 421, while the other buffer of ping pong buffer 496 holds a data set from channel detector 409 that is currently being interleaved. Similarly, one of the buffers in ping pong buffer 498 holds the result of a prior interleaving process of the output from channel detector 417 and is unloaded to LDPC decoder 437 via multiplexer 421, while the other buffer of ping pong buffer 498 holds a data set from channel detector 417 that is currently being interleaved.

One or more passes (i.e., local iterations) through LDPC decoder 437 may be desired. In such cases, the internal messages of LDPC decoder 437 may be multiplied by a local dynamic scalar value that is generated by a local dynamic scalar circuit 439. This multiplication process may be implemented similar to that discussed above in relation to FIG. 3.

In some embodiments of the present invention, local dynamic scalar circuit 439 provides an initial local scalar value that is used on a first global iteration (i.e., processing through channel detector 409 and LDPC decoder 437), and the same local scalar value is used for each successive local iteration that follows the particular global iteration. As each additional global iteration occurs (i.e., processing through channel detector 417 and LDPC decoder 437), the scalar value is reduced by a defined amount, and the reduced scalar value is used for the succeeding local iterations.

Once the desired local iterations are completed by LDPC decoder 437, the resulting decoded data is either provided as a hard decision output 441 or as an output 485 to a de-interleaver circuit 445 that uses queue buffer 449 to de-interleave the decoded data and to store the de-interleaved data until channel detector 417 is available for further processing.

One of the buffers in queue buffer 449 holding the result of a prior de-interleaving process and is unloaded to channel detector 417, while another buffer of queue buffer 449 holds a decoded data set currently being de-interleaved, and one or more other buffers in queue buffer 449 maintain other non-converged data waiting for processing by channel detector 417. Non-converged data from queue buffer 449 is de-interleaved by de-interleaver 445 and passed to channel detector 417 that has access to the corresponding data set in memory buffer 413. In particular, the de-interleaved data from de-interleaver 445 is multiplied by a dynamic scaling factor 407 ($\beta_x$) using a multiplier circuit 427, and a product output of multiplier 429 is provided to channel detector 417. The data detection performed by channel detector 417 is similar to that performed by channel detector 409. Alternatively, where a data set converges in LDPC decoder 437, it is provide as hard decision output 441 to a de-interleaver circuit 457 that de-interleaves the received hard decision output 441 and stores the de-interleaved result in one of a number of memory buffers 461. Ultimately, de-interleaver circuit 457 provides the de-interleaved data stored in memory buffers 461 as an output 471.

Dynamic scaling factor 403 and dynamic scaling factor 407 are calculated for each codeword based upon a decoded output 485 corresponding to the respective codeword. Each buffer in queue buffer 449 includes an area 441 for storing decoded output 485 for a respective codeword, and another area 443 for storing dynamic scaling factor 403 and dynamic scaling factor 407 corresponding to the respective codeword. When the decoded output is pulled from a respective queue buffer for de-interleaving and processing by channel detector 417, the values for scaling factor 403 and scaling factor 407 are pulled from area 441 of the corresponding queue buffer and used for multiplication by multiplier 493.

A dynamic scalar calculation circuit 497 calculates the value for scaling factor 403 and scaling factor 407 for each respective codeword based upon decoded output 485 corresponding to the respective codeword. The calculated scaling factors are stored to the buffer in queue buffer 449 that the corresponding to decoded output 485 from which the scaling factors were calculated.

Using decoded output 485, dynamic scalar calculation circuit 497 first determines whether the values for scaling factor 403 and scaling factor 407 are to be updated. In particular, dynamic scalar computation circuit 497 receives an indication of the number of parity checks for the data set currently processed by LDPC decoder circuit 437 that remain violated. This number is referred to herein as the violation count. Further, dynamic scalar computation circuit 497 counts the number of bit periods in decoded output 485 that are saturated (i.e., have a value equal to the maximum achievable value). This value is referred to as the saturation count. Dynamic scalar computation circuit 497 compares the violation count with a threshold value 423 and compares the saturation count with another threshold value 425. In some embodiments, both threshold value 423 and threshold value 425 are programmable. The values of scaling factor 403 and scaling factor 407 are updated if either the violation count is less than threshold value 423 or if the saturation count is greater than threshold 425. The following pseudocode describes the update condition:

```
If (violation count < threshold 423 || saturation count > threshold 425) {
    Update Scaling Factors
}
Else {
    Maintain Scaling Factors
}
```

In an exemplary case, dynamic modification of scaling factor 403 and scaling factor 407 is only done whenever there is a significant number of saturated soft decisions.

Whenever an update is called for, updating scaling factor 403 and scaling factor 407 may be done in a variety of ways depending upon the particular implementation. For example, updating may be done by initially setting scaling factor 403 and scaling factor 407 equal to default values. The following pseudocode describes the initial condition:

Scaling Factor 407=$\beta_{default}$; and

Scaling Factor 403=$\alpha_{default}$.

The default values, $\beta_{default}$ and $\alpha_{default}$ may be hard coded at design time, or may be programmable allowing for update depending upon a particular deployment of queuing detection and decoding circuit 499. The default values, $\beta_{default}$ and $\alpha_{default}$ may be selected to provide good performance with only minimal saturation. In one embodiment, upon a decision to update the value of scaling factor 403 and scaling factor 407, scaling factor 403 and scaling factor 407 are modified to be minimum value scaling factors in accordance with the following pseudocode:

```
If (violation count < threshold 423 || saturation count > threshold 425) {
    Scaling Factor 407 = β_maximum; and
    Scaling Factor 403 = α_minimum
}
Else {
    Scaling Factor 407 = β_default; and
    Scaling Factor 403 = α_default
}
```

The values of $\beta_{maximum}$ and $\alpha_{minimum}$ are may be hard coded at design time, or may be programmable allowing for update depending upon a particular deployment. The default values, $\beta_{maximum}$ and $\alpha_{minimum}$ may be selected to provide good performance but with values set to avoid some saturation allowed by the default scaling factors.

Queuing detection/decoding circuit 499 allows for performance of a variable number of detection and decoding iterations depending upon the introduced data. Further, in some cases, considerable power savings may be achieved through use of queuing detection/decoding circuit 499. Yet further, in some cases, a faster LDPC decoder may be implemented allowing for an increased throughput where substantial first iteration data convergence exists as multiple iterations are not necessarily required. Yet further, by allowing results of LDPC decoder 437 to be reported out of order, upstream processing does not have to wait for the completion of downstream processing. Re-ordering of the out of order results may be done by queuing detection/decoding circuit 499 or by a downstream recipient of output 471. In addition, using a dynamic scalar within decoder 437 allows for resolving substantially noise free areas of a codeword quickly using a relatively high local scalar value, and to resolve more noisy areas of a codeword using a relatively small local scalar value. Based upon the disclosure provided herein, one of ordinary skill in the art will recognize a variety of other advantages that may be achieved through implementation of one or more embodiments of the present invention.

Figure 5A:
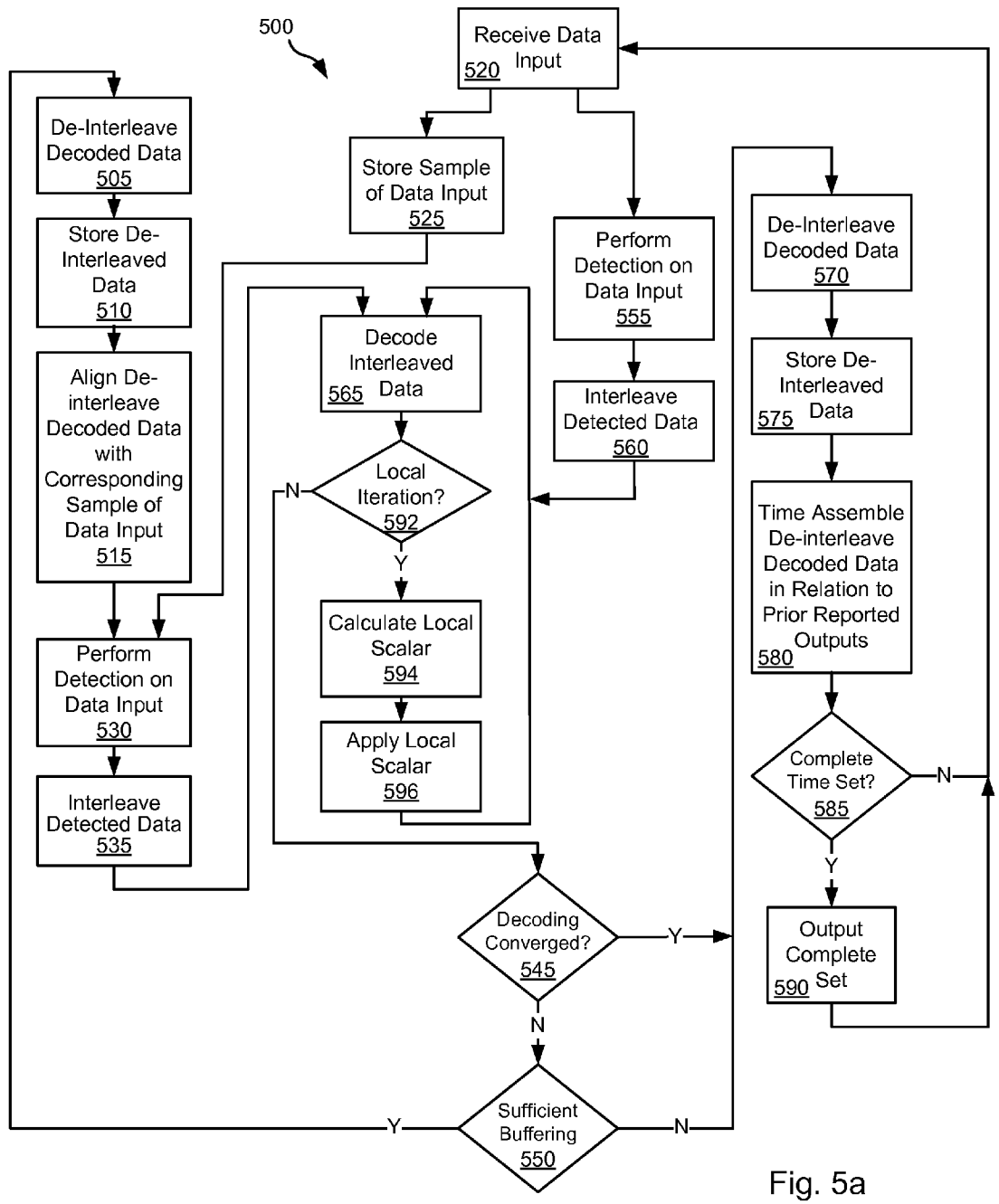
FIG. 5a is a flow diagram showing a method in accordance with some embodiments of the present invention for data processing using dynamic scaling of the decoder messages.

Turning to FIG. 5a, a flow diagram 500 shows a method in accordance with some embodiments of the present invention for data processing using dynamic scaling of the decoder messages. Following flow diagram 500, a data input is received (block 520). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 525). Data detection processes are performed on the received data (block 555). The resulting detected data is interleaved (block 560).

The interleaved data is decoded (block 565). It is then determined whether another local iteration (i.e., another pass through the decoder is desired) (block 592). This determination may be made based upon whether the decoder converged, and whether a failure to converge would be benefited by an additional pass through the decoder. Any approach for determining a need for an additional local decoder loop that is known in the art may be used. Where an additional local iteration (i.e., another pass through the decoding process) is desired (block 592), a local scalar is calculated (block 594). In some cases, this local scalar calculation involves selecting from one of a number of predetermined scalar values. In some embodiments of the present invention, an initial local scalar value is used on the first global iteration (i.e., performance of both data detection and data decoding), and the same local scalar value is used for each successive local iteration that follows the global iteration. As each additional global iteration occurs, the scalar value is reduced by a defined amount, and the reduced scalar value is used for the succeeding local iterations. In one particular embodiment of the present invention, the initial scalar value is 0.75, and on each successive global iteration the scalar value is reduced by a hardware friendly value of 1/32. Thus, on the second global iteration the scalar value is 0.7188; on the third global iteration the scalar value is 0.6875; on the fourth global iteration the scalar value is 0.6563; on the fifth global iteration the scalar value is 0.625; on the sixth global iteration the scalar value is 0.5938; on the seventh global iteration the scalar value is 0.5625; on the eighth global iteration the scalar value 0.5313; on the ninth global iteration the scalar value is 0.5. At some point, the scalar value is not reduced and remains constant. Thus, using the preceding example, on the tenth and later global iterations, the scalar value is maintained at 0.5. It should be noted that in other embodiments of the present invention that the scalar value may be modified after each local iteration in addition to, or in place of modification that occurs after each global iteration. The internal values of the decoder circuits are multiplied by the local scalar value (block 596) and the decoder process is repeated (block 565). It is then determined whether another local iteration is desired (block 592).

As a general rule, using a higher local scalar value results in increasing the rate of convergence by a decoder where there is low noise. In contrast, using a lower local scalar value results in reducing the rate of convergence while increasing the possibility of convergence where higher noise is exhibited in one or more of the bits in the data stream. The higher probability of convergence occurs because bits multiplied by a smaller scalar is less likely to saturate the decoder circuit and therefore more data is maintained for use in the decoding process. By using a variable local scalar value, some embodiments of the present invention provide for relatively fast convergence on various areas in a codeword that exhibit lower levels of noise. Later, the areas in a codeword that exhibit higher levels of noise are treated with progressively lower scalars that reduce the rate of convergence, but increase the range of data that may be used to achieve the convergence.

Where it is determined that additional local iterations are not desired (block 592), it is determined whether the decoding process converged (block 545), and whether there is sufficient buffering available to reprocess the data (block 550). Where either the decoding process converged (block 545) or there is insufficient buffering available (block 550), the decoded data is de-interleaved (block 570) and stored in a buffer (block 575). The buffer includes various results that may have become available out of order, and as such the various results are reordered in the buffer to represent the order in which the corresponding data input was originally received (block 580). It is then determined if a complete time set is available in the buffer (block 585). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 585) or where the results are to be reported as they are received without regard to order, the result(s) are output to a recipient (block 590).

Alternatively, where the decoding process failed to converge (block 545) and there is sufficient buffering available (block 550), another global iteration is performed. The global iteration includes de-interleaving the decoded data (block 505) and storing the de-interleaved decoded data to a buffer (block 510). The de-interleaved data is aligned with the corresponding sample of the data input (block 515) once the data detector is available. The de-interleaved data and the corresponding sample data input is provided to the data detector where a subsequent data detection is performed (block 530) on the originally stored sample of data input (block 525) using the soft input developed in the earlier processing of the same data input (blocks 555, 560, 565, 592, 594, 596, 545, 550, 505, 510, 515). The result of the data detection process is interleaved (block 535) and the interleaved data is decoded (block 565). At this point, the processes of blocks 592, 594, 596, 545, 550 are repeated.

Figure 5B:
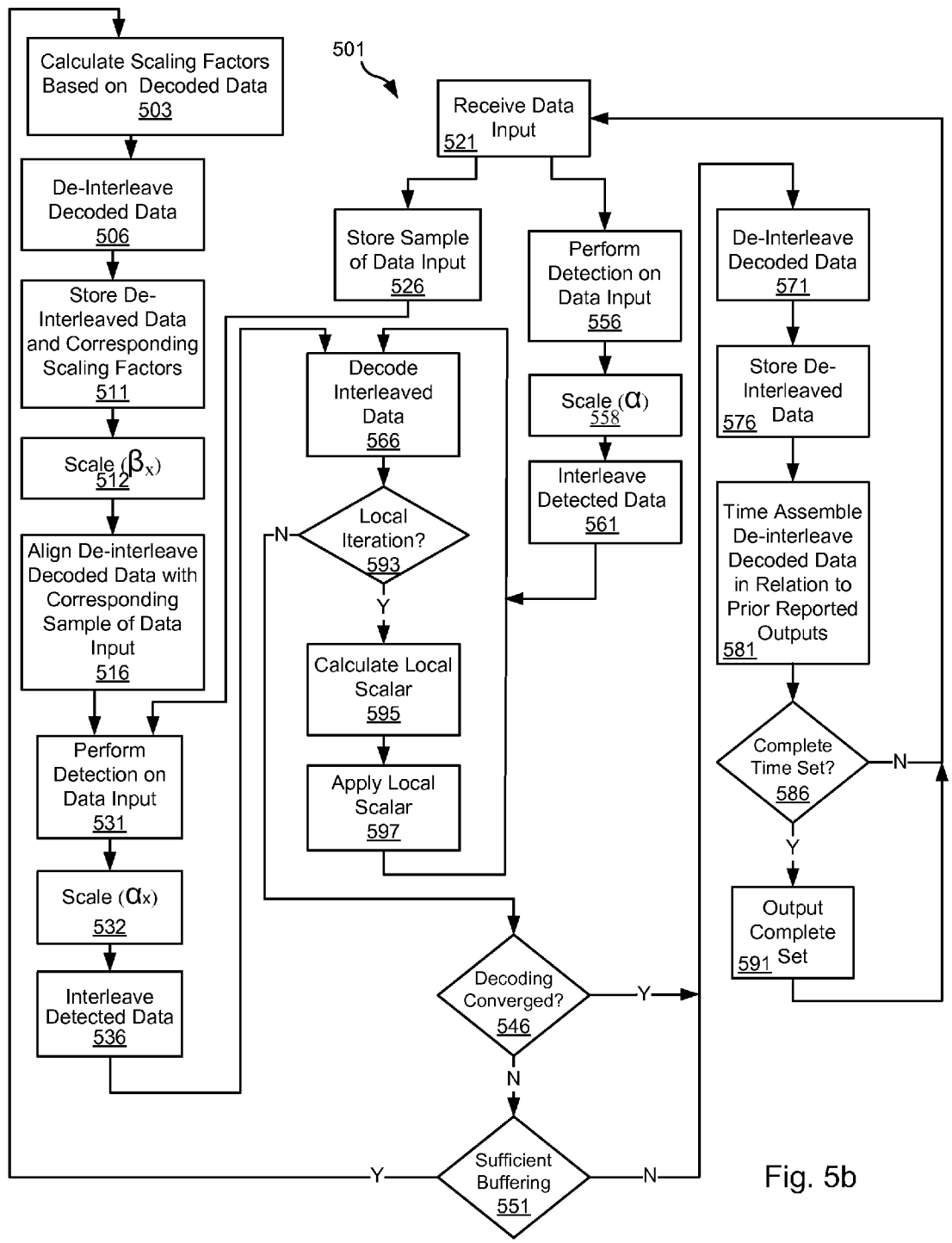
FIG. 5b is a flow diagram showing a method in accordance with some embodiments of the present invention for data processing using dynamic scaling of the decoder messages and dynamic scaling in the global processing loop

Turning to FIG. 5b, a flow diagram 501 shows a method in accordance with some embodiments of the present invention for data processing using dynamic scaling of the decoder messages and dynamic scaling in the global processing loop. Following flow diagram 501, a data input is received (block 521). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 526), and data detection processes are performed on the received data (block 556). The resulting detected data is multiplied by a scaling factor ($\alpha$) (block 558), and the product of the multiplication is interleaved (block 561).

The interleaved data is decoded (block 566). It is then determined whether another local iteration (i.e., another pass through the decoder is desired) (block 593). This determination may be made based upon whether the decoder converged, and whether a failure to converge would be benefited by an additional pass through the decoder. Any approach for determining a need for an additional local decoder loop that is known in the art may be used. Where an additional local iteration (i.e., another pass through the decoding process) is desired (block 592), a local scalar is calculated (block 595). In some cases, this local scalar calculation involves selecting from one of a number of predetermined scalar values. In some embodiments of the present invention, an initial local scalar value is used on the first global iteration (i.e., performance of both data detection and data decoding), and the same local scalar value is used for each successive local iteration that follows the global iteration. As each additional global iteration occurs, the scalar value is reduced by a defined amount, and the reduced scalar value is used for the succeeding local iterations. In one particular embodiment of the present invention, the initial scalar value is 0.75, and on each successive global iteration the scalar value is reduced by a hardware friendly value of 1/32. Thus, on the second global iteration the scalar value is 0.7188; on the third global iteration the scalar value is 0.6875; on the fourth global iteration the scalar value is 0.6563; on the fifth global iteration the scalar value is 0.625; on the sixth global iteration the scalar value is 0.5938; on the seventh global iteration the scalar value is 0.5625; on the eighth global iteration the scalar value 0.5313; on the ninth global iteration the scalar value is 0.5. At some point, the scalar value is not reduced and remains constant. Thus, using the preceding example, on the tenth and later global iterations, the scalar value is maintained at 0.5. It should be noted that in other embodiments of the present invention that the scalar value may be modified after each local iteration in addition to, or in place of modification that occurs after each global iteration. The internal values of the decoder circuits are multiplied by the local scalar value (block 597) and the decoder process is repeated (block 566). It is then determined whether another local iteration is desired (block 593).

As a general rule, using a higher local scalar value results in increasing the rate of convergence by a decoder where there is low noise. In contrast, using a lower local scalar value results in reducing the rate of convergence while increasing the possibility of convergence where higher noise is exhibited in one or more of the bits in the data stream. The higher probability of convergence occurs because bits multiplied by a smaller scalar is less likely to saturate the decoder circuit and therefore more data is maintained for use in the decoding process. By using a variable local scalar value, some embodiments of the present invention provide for relatively fast convergence on various areas in a codeword that exhibit lower levels of noise. Later, the areas in a codeword that exhibit higher levels of noise are treated with progressively lower scalars that reduce the rate of convergence, but increase the range of data that may be used to achieve the convergence.

Where it is determined that additional local iterations are not desired (block 593), it is determined whether the decoding process converged (block 546), and whether there is sufficient buffering available to reprocess the data (block 551). Where either the decoding process converged (block 546) or there is insufficient buffering available (block 551), the decoded data is de-interleaved (block 571) and stored in a buffer (block 576). The buffer includes various results that may have become available out of order, and as such the various results are reordered in the buffer to represent the order in which the corresponding data input was originally received (block 581). It is then determined if a complete time set is available in the buffer (block 586). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 586) or where the results are to be reported as they are received without regard to order, the result(s) are output to a recipient (block 591).

Alternatively, where the decoding process failed to converge (block 546) and there is sufficient buffering available (block 551), another global iteration is performed. The global iteration includes calculating global scaling factors, $\beta_x$ and $\alpha_x$, based upon the decoded data (block 503). The scaling factors may be calculated using one of the approaches described below in relation to FIGS. 6a-6c. The decoded data is also de-interleaved (block 506) and the de-interleaved decoded data is stored to a buffer (block 510). The de-interleaved data is aligned with the corresponding sample of the data input (block 516) once the data detector is available, and multiplied by the scaling factor $\beta_x$ (block 512). The de-interleaved data and the corresponding sample data input is provided to the data detector where a subsequent data detection is performed (block 531) on the originally stored sample of data input (block 526) using the soft input developed in the earlier processing of the same data input (blocks 556, 558, 561, 566, 593, 595, 597, 546, 551, 503, 506, 511, 512, 516). The detected data is multiplied by the scaling factor $\alpha_x$ (block 532). The result of the data detection process is interleaved (block 536) and the interleaved data is decoded (block 566). At this point, the processes of blocks 593, 595, 597, 546, 551 are repeated.

Figure 6A:
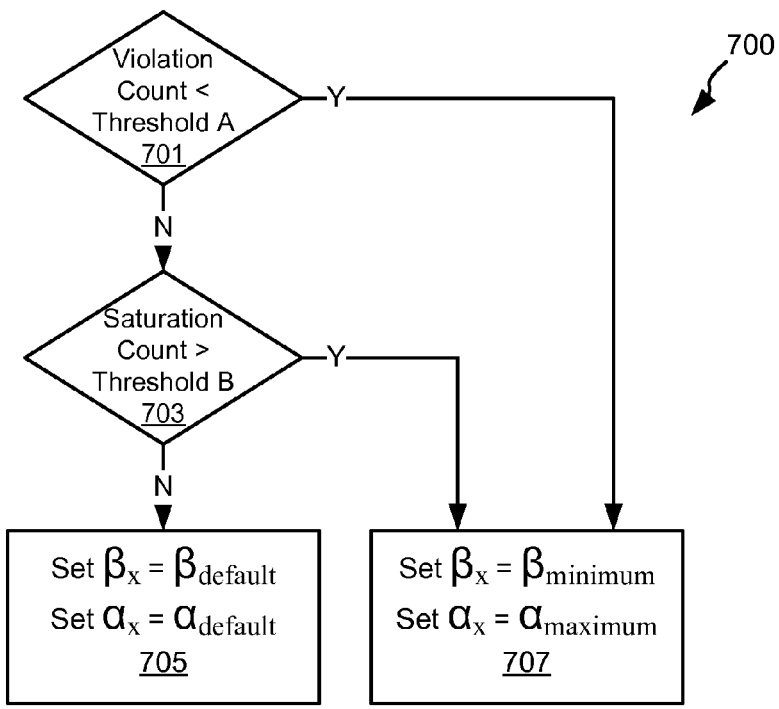
FIGS. 6a-6d are four flow diagrams showing different approaches for dynamically calculating scaling factors in accordance with different embodiments of the present invention.
Figure 6B:
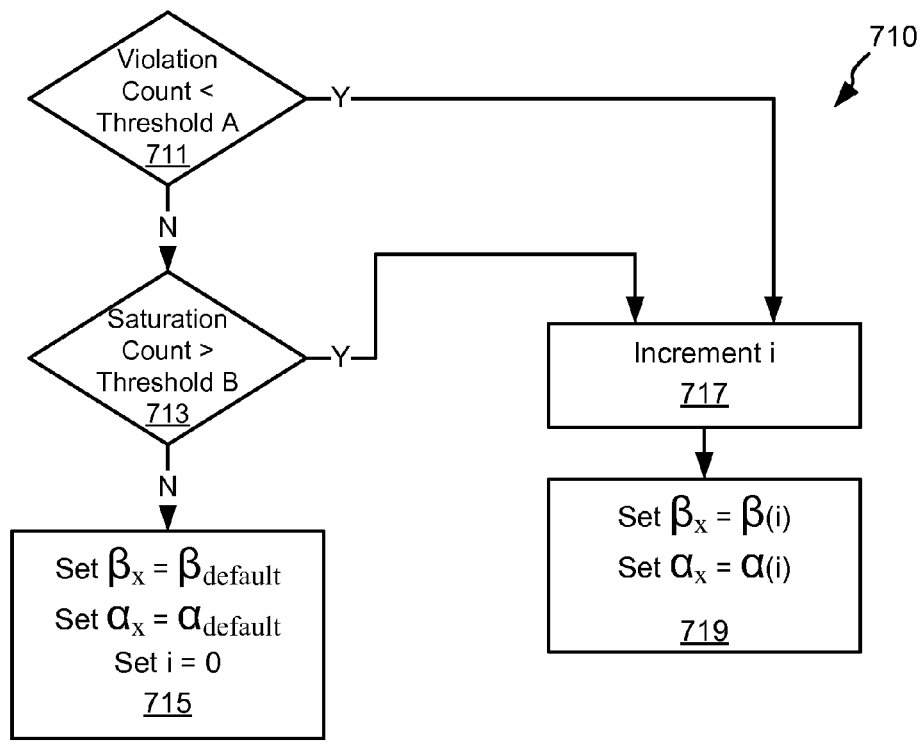
Figure 6C:
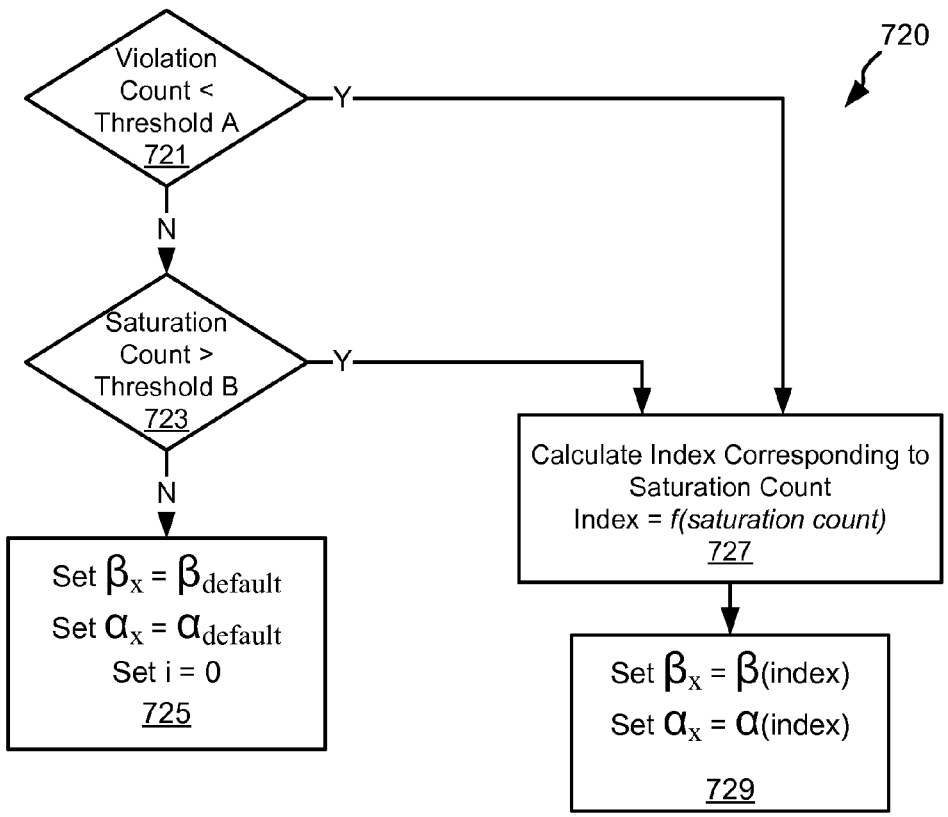
Figure 6D:
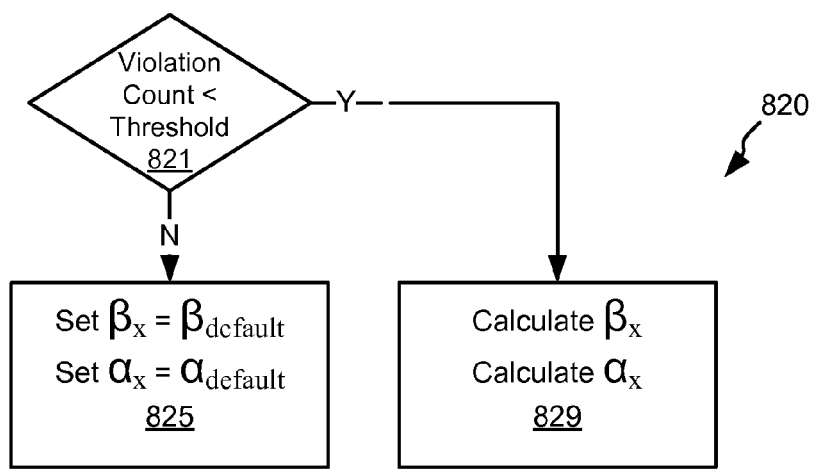

Turning to FIGS. 6a-6c, three different approaches for dynamically calculating scaling factors for the global loop are shown in accordance with different embodiments of the present invention. Following flow diagram 700 of FIG. 6a, each time a decode process is completed, it is determined whether the violation count is less than a first threshold (i.e., Threshold A) (block 701) or whether the saturation count is greater than a second threshold (i.e., Threshold B) (block 703). Where either are true (blocks 701, 703), the scaling factors are updated (block 707). In particular, the scaling factors are updated in accordance with the following equations:

$\beta$ Scaling Factor=$\beta_{maximum}$; and $\alpha$ Scaling Factor=$\alpha_{minimum}$.

Otherwise, where an update is not called for (blocks 701, 703), scaling factors are set to default levels (block 705) in accordance with the following equations:

$\beta$ Scaling Factor=$\beta_{default}$; and $\alpha$ Scaling Factor=$\alpha_{default}$.

Following flow diagram 710 of FIG. 6b, each time a decode process is completed, it is determined whether the violation count is less than a first threshold (i.e., Threshold A) (block 711) or whether the saturation count is greater than a second threshold (i.e., Threshold B) (block 713). Where either are true (blocks 711, 713), an index (i) used to access scaling data from a lookup table is incremented (block 717). The scaling factors are then pulled from the lookup table using the index (block 729). In particular, the scaling factors are updated in accordance with the following equations:

$\beta$ Scaling Factor=$\beta(i)$; and $\alpha$ Scaling Factor=$\alpha(i)$.

$\beta(i+1)$ is greater than $\beta(i)$ and $\alpha(i+1)$ is less than $\alpha(i)$. Otherwise, where an update is not called for (blocks 711, 713), the scaling factors are set to default levels (block 715) in accordance with the following equations:

$\beta$ Scaling Factor=$\beta_{default}$; and $\alpha$ Scaling Factor=$\alpha_{default}$.

Following flow diagram 720 of FIG. 6c, each time a decode process is completed, it is determined whether the violation count is less than a first threshold (i.e., Threshold A) (block 721) or whether the saturation count is greater than a second threshold (i.e., Threshold B) (block 723). Where either are true (blocks 721, 723), an index corresponding to the saturation count is calculated (block 727). In some cases, the index is the saturation count multiplied by a scalar value and raised to the next whole number. The scaling factors are then pulled from the lookup table using the index (block 729). In particular, the scaling factors are updated in accordance with the following equations:

β Scaling Factor=β(index); and

α Scaling Factor=α(index).

β(i+1) is greater than β(i) and α(i+1) is less than α(i). Otherwise, where an update is not called for (blocks 721, 723), the scaling factors are set to default levels (block 725) in accordance with the following equations:

β Scaling Factor=$β_{default}$; and

α Scaling Factor=$α_{default}$.

Following flow diagram 820 of FIG. 6b, each time a decode process is completed, it is determined whether the violation count is less than a threshold (block 821). Where this is true (blocks 821), scaling factors ($β_x$, $α_x$) are calculated (block 829). Otherwise, where an update is not called for (block 821), the scaling factors are set to default levels (block 825) in accordance with the following equations:

β Scaling Factor=$β_{default}$; and

α Scaling Factor=$α_{default}$.

Figure 7:
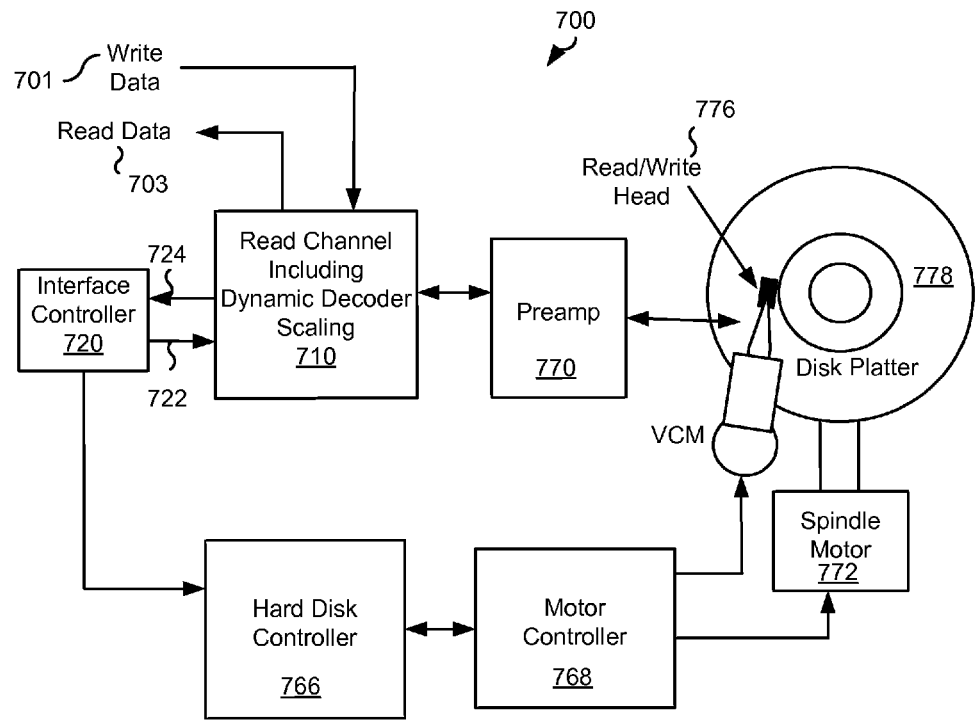
FIG. 7 shows a storage system with dynamic decoder scaling in accordance with various embodiments of the present invention.

Turning to FIG. 7, a storage system 700 including read channel 710 including dynamic decoder scaling in accordance with various embodiments of the present invention. Storage system 700 may be, for example, a hard disk drive. Read channel 710 may include, but is not limited to, a data processing codec similar to those described above in relation to FIG. 2 or FIG. 4 that include a decoder circuit including dynamic scaling. In some cases, the data processing codec may operate similar to that described in relation to one of FIG. 5.

Storage system 700 also includes a preamplifier 770, an interface controller 720, a hard disk controller 766, a motor controller 768, a spindle motor 772, a disk platter 778, and a read/write head assembly 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with a perpendicular recording scheme. For example, the magnetic signals may be recorded as either longitudinal or perpendicular recorded signals.

In a typical read operation, read/write head assembly 776 is accurately positioned by motor controller 768 over a desired data track on disk platter 778. The appropriate data track is defined by an address received via interface controller 720. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel 710 via preamplifier 770. Preamplifier 770 is operable to amplify the minute analog signals accessed from disk platter 778. In turn, read channel module 710 decodes and digitizes the received analog signal to recreate the information originally written to disk platter 778. The decoding process may utilize local iterative loops where the output of the decoder circuit is dynamically scaled and provided as an input to the decoder circuit. This input is decoded again. The read data is provided as read data 703. A write operation is substantially the opposite of the preceding read operation with write data 701 being provided to read channel module 710. This data is then encoded and written to disk platter 778.

Figure 8:
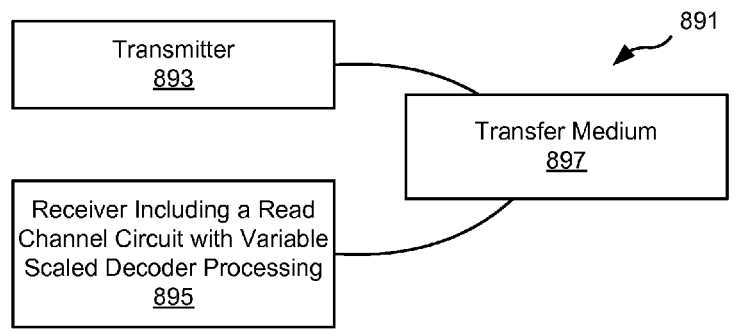
FIG. 8 depicts a communication system including a receiver having a read channel circuit with variable scaled decoder processing in accordance with different embodiments of the present invention.

Turning to FIG. 8, a communication system 891 including a receiver 895 having a read channel circuit with variable scaled decoder processing in accordance with different embodiments of the present invention. Communication system 891 includes a transmitter 893 that is operable to transmit encoded information via a transfer medium 897 as is known in the art. The encoded data is received from transfer medium 897 by receiver 895. Receiver 895 incorporates a read channel circuit with variable scaled decoder processing. The incorporated read channel circuit is capable of adaptively calculating decoder scaling factors based upon processing of an input stream. Thus, the adaptive calculation circuit may be implemented in accordance with that described above in relation to FIGS. 2-5. Based on the disclosure provided herein, one of ordinary skill in the art will recognize a variety of mediums for which equalization and targeting in accordance with embodiments of the present invention may be done.

In conclusion, the invention provides novel systems, devices, methods and arrangements for performing data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data processing system, the data processing system including:
    a data detector circuit operable to receive a data input and to provide a detected output;
    a data decoder circuit operable to perform one or more local iterations on a decoder input derived from the detected output and to provide a decoded output, wherein the decoder circuit is operable to perform a data decoding algorithm by processing at least one decoder message, wherein the decoder circuit includes a scalar circuit operable to multiply the decoder message by a variable scalar value including a first scalar value and a second scalar value, wherein the first scalar value is always larger than the second scalar value, wherein the decoder circuit is operable to perform a first decoding process and a second decoding process, and wherein the scalar circuit multiplies the decoder message by a first scalar value during the first decoding process and by a second scalar value during the second decoding process.

2. The data processing system of claim 1, wherein the first decoding process is performed as part of a first global iteration including processing through both the data detector circuit and the data decoder circuit, and wherein the second decoding process is performed as part of a second global iteration including processing through both the data detector circuit and the data decoder circuit.

3. The data processing system of claim 1, wherein the first decoding process is performed as part of a first local iteration within the data decoder circuit, and wherein the second decoding process is performed as part of a second local iteration within the data decoder circuit.

4. The data processing circuit of claim 1, wherein the first scalar value is selected to encourage rapid convergence of the data decoding algorithm, and wherein the second scalar value is selected to provide enhanced information to the data decoding algorithm.

5. The data processing system of claim 1, wherein the data decoder circuit is a low density parity check decoder.

6. The data processing system of claim 5, wherein the low density parity check decoder includes at least one variable node and at least one check node, and wherein the decoder message is passed from the variable node to the check node.

7. The data processing system of claim 5, wherein the low density parity check decoder includes at least one variable node and at least one check node, and wherein the decoder message is passed from the check node to the variable node.

8. The data processing system of claim 1, wherein the data processing system is implemented as part of a storage device.

9. The data processing circuit of claim 1, wherein the data processing system is implemented as part of a data transmission device.

10. The data processing circuit of claim 1, wherein the data detector circuit is selected from a group consisting of: a maximum a posteriori data detector circuit, and a Viterbi algorithm data detector circuit.

11. A method for data processing, the method comprising:
receiving a data input;
applying a data detection algorithm by a data decoder circuit to the data input to yield a detected output;
performing at least a first local iteration and a second local iteration through a data decoder circuit on a decoder input to yield a decoded output, wherein the decoder input is derived from the detected output, wherein performing the first local iteration includes processing at least a first decoder message and scaling the first decoder message by a first scalar value, wherein performing the second local iteration includes processing at least a second decoder message and scaling the second decoder message by a second scalar value, and wherein the first scalar value is always larger than the second scalar value.

12. The method of claim 11, wherein the first local iteration is performed as part of a first global iteration including processing through both the data detector circuit and the data decoder circuit, and wherein the second local iteration is performed as part of a second global iteration including processing through both the data detector circuit and the data decoder circuit.

13. The method of claim 11, wherein the second local iteration is performed during the same global iteration as the first local iteration.

14. The method of claim 11, wherein the first scalar value is selected to encourage rapid convergence of the data decoding algorithm, and wherein the second scalar value is selected to provide enhanced information to the data decoding algorithm.

15. The method of claim 11, wherein the data decoder circuit is a low density parity check decoder.

16. The method of claim 15, wherein the low density parity check decoder includes at least one variable node and at least one check node, and wherein the decoder message is passed from the variable node to the check node.

17. The method of claim 15, wherein the low density parity check decoder includes at least one variable node and at least one check node, and wherein the decoder message is passed from the check node to the variable node.

18. The method of claim 11, wherein the data detector circuit is selected from a group consisting of: a maximum a posteriori data detector circuit, and a Viterbi algorithm data detector circuit.

* * * * *